United States Patent

Nelson

[15] 3,704,515

[45] Dec. 5, 1972

[54] METHOD FOR MOUNTING CONNECTORS ON PRINTED CIRCUIT BOARDS

[72] Inventor: Robert D. Nelson, Covina, Calif.

[73] Assignee: Burroughs Corporation, Detroit, Mich.

[22] Filed: Dec. 10, 1969

[21] Appl. No.: 883,861

[52] U.S. Cl. ......................29/626, 29/423, 156/249, 174/68.5, 317/101 C, 317/101 CC, 339/17 R

[51] Int. Cl. ..........................H05k 3/30, B21p 17/00

[58] Field of Search................29/625, 626, 627, 423; 156/249; 317/101; 339/17 R

[56] References Cited

UNITED STATES PATENTS

| | | | |
|---|---|---|---|
| 2,983,853 | 5/1961 | Williams | 29/626 UX |
| 2,934,814 | 5/1960 | Williams et al. | 29/626 |
| 3,114,807 | 12/1963 | Koda | 29/626 UX |
| 3,158,927 | 12/1964 | Saunders | 29/626 X |
| 3,350,250 | 10/1967 | Sanz et al. | 29/626 X |
| 3,388,465 | 6/1968 | Johnson | 29/626 |
| 3,538,389 | 11/1970 | Leoesque et al. | 156/249 X |

OTHER PUBLICATIONS

Printed and Integrated Circuitry, by Schlabach & Rider, pages 254 and 255.

IBM Tech Disclosure, Vol. 9 No. 11 April 1967, by Penna et al., entitled Assembly of Circuit Cards through the use of Tape Adhesives, Page 1625.

*Primary Examiner*—John F. Campbell

*Assistant Examiner*—Robert W. Church

*Attorney*—Christie, Parker & Hale

[57] ABSTRACT

A method for mounting a connector with molded-in contacts on a printed circuit board using adhesive material for temporarily bonding the connector to the board during the time that the terminal pins of the molded-in contacts are permanently bonded to the board.

1 Claim, 3 Drawing Figures

INVENTOR.
ROBERT D. NELSON

BY

Christie, Parker & Hale
ATTORNEYS

METHOD FOR MOUNTING CONNECTORS ON PRINTED CIRCUIT BOARDS

BACKGROUND OF THE INVENTION

1. Field of the Invention

This invention pertains to methods for permanently bonding connectors to printed circuit boards.

2. Description of the Prior Art

Present methods for fastening connectors to printed circuit boards make use of nuts, bolts, washers, and spacers. This is time-consuming and prevents closer spacing of the boards. Furthermore, before the actual bolting can take place, the connector is capable of shifting its position on the board causing misalignment and difficulties in fabrication. It is desirable, therefore, to eliminate the possibility of such shifting or slippage and to further decrease the time and expense involved in permanently fastening the connector to the printed circuit board.

SUMMARY OF THE INVENTION

This invention overcomes the disadvantages heretofore mentioned inherent in present day methods for mounting connectors onto printed circuit boards. An adhesive material is affixed to a portion of a connector body which contains molded-in contacts having terminal pins extending from the body. The connector is positioned over the board such that a terminal pin from each of the molded-in contacts passes through a distinct one of a plurality of apertures formed in the board and designed to accommodate such terminal pins. Force is then exerted on the connector body in order to affix another portion of the adhesive material to the board such that the connector body is temporarily bonded to the board by the adhesive material. Those terminal pins which have been passed through the apertures are then secured to conductive members, mounted on the board peripherally about the apertures and which form part of the printed circuit, such that the connector body is permanently bonded to the board and its molded-in contacts are permanently and conductively connected to the printed circuit.

As a result, an inexpensive and rapid method and apparatus is provided for temporarily holding the connector in place on the printed circuit board until the terminal pins are permanently secured thereto in the manner above described.

DESCRIPTION OF THE PREFERRED EMBODIMENT

Figure 1:
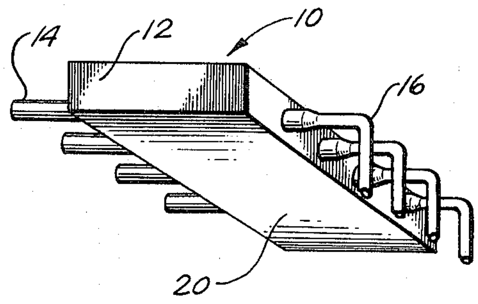
FIG. 1 is a perspective elevation view of a connector with molded-in contacts and L-shaped terminal pins on the ends of the contacts.
Figure 2:
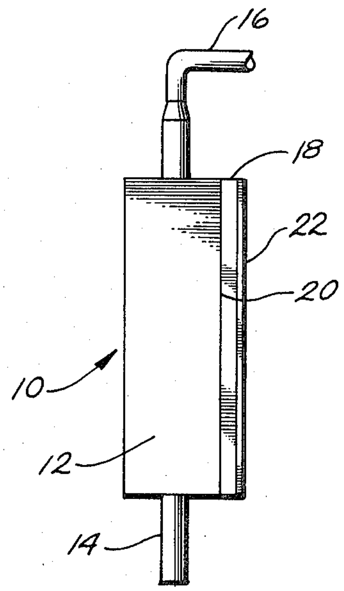
FIG. 2 is a side elevation view of the connector of FIG. 1 with adhesive material and removable paper backing affixed thereto.

FIG. 1 shows one type of connector 10, for mounting on a printed circuit board, having a connector body 12, molded-in contacts 14, and terminal pins 16 formed on one end of the contacts 14. According to the invention, adhesive material 18, such as double-side tape (FIG. 2), is affixed to the bottom face 20 of the connector body 12. As shown in FIG. 2, a removable non-adhesive backing 22 is affixed to the side of adhesive 18 which is not affixed to connector body 12. This backing is useful during the storage of the connectors prior to mounting on the printed circuit board.

Figure 3:
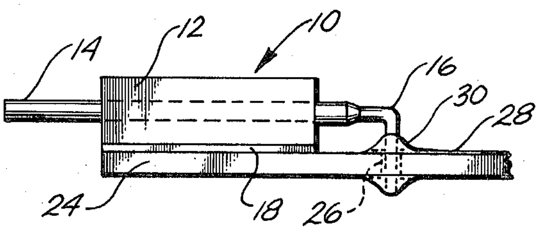
FIG. 3 is a side view of the connector of FIG. 2 with the paper backing removed and the connector mounted on a printed circuit board according to the invention.

Printed circuit board 24, shown in FIG. 3, has a plurality of apertures 26 therein (only one being shown) which are designed to accommodate terminal pins 16 when the connector is mounted on the board. Conductive members 28 are permanently mounted on the board and form part of the printed circuit. These members 28 are fabricated such that, when mounted, each peripherally surrounds a respective one of apertures 26. Solder 30 is used to permanently and conductively couple terminal pins 16 to members 28 and thus the printed circuit.

The exact method of permanently mounting connector 10 on printed circuit board 24 consists of the steps of affixing one side of adhesive material 18 to the bottom face 20 of connector body 12, such adhesive having removable non-adhesive backing 22 affixed to its other side; removing backing 22; positioning connector 10 over printed circuit board 24 such that its bottom face 20 is substantially parallel with the printed circuit board; moving connector 10 substantially perpendicularly toward board 24 until terminal pins 16 pass through their respective apertures 26; exerting force on the upper face of connector body 12 in order to insure that the other side of the adhesive has become adhesively bonded with the printed circuit board, such that the connector 10 is temporarily bonded to the board 24; and soldering terminal pins 16 to their respective members 28 mounted on the board, such that connector 10 is permanently mounted to the board and its molded-in contacts 14 are permanently conductively connected to the printed circuit through members 28.

It is important to note that adhesive material 18 is immaterial after permanent bonding is effectuated by solder 30. Any consequent loss of adhesiveness by adhesive material 18 is, therefore, inconsequential and irrelevant. The sole purpose of the adhesive is to temporarily bond connector 10 to circuit board 24 before and during the time that it is permanently affixed and conductively connected thereto by solder 30 in the manner above described.

What has been disclosed, therefore, is an inexpensive and rapid method and apparatus for first temporarily and then permanently bonding a connector onto a printed circuit board.

Although one embodiment of the invention has been shown by way of example, other embodiments will be evident to those skilled in the art. For example, the pins 16 may extend out of the bottom surface 20 of the connector or out of other parts of the connector.

I claim:

1. A method for mounting a connector to a surface of a printed circuit board of a first large size, wherein the connector includes a connector body having an elongated planar surface of a second, smaller size and having a plurality of electrical contacts, the contacts having parallel terminal pins formed at one end and projecting from the body perpendicular to the connector body surface, the contacts having male connector pins at their opposite ends projecting from the body parallel to the connector body to permit a mating electrical connection thereto, the printed circuit board surface having near one of its marginal edges at spaced apart locations corresponding to the spacing between the terminal pins a plurality of apertures each being large enough to accommodate a respective one of the terminal pins, and a conductive member disposed about each of said apertures, the method comprising the steps of:

adhesively affixing to the connector body surface a first side of a piece of tape having pressure-sensitive adhesive material covering a second, opposite side and a removable non-adhesive backing covering the adhesive material;

removing the backing from the tape to expose the adhesive material;

positioning the smaller size connector body surface having the exposed adhesive material adjacent to the larger size printed circuit board while passing each of the terminal pins through a distinct one of the apertures and orienting the male connector pins parallel with the printed circuit board and projecting away from said marginal end of the printed circuit board surface;

exerting a force on the connector body in the direction of the printed circuit board in order to affix the exposed adhesive material covering the tape to the larger size printed circuit board such that the connector body is temporarily bonded to the board by the exposed adhesive material; and soldering the terminal pins to the conductive members about the apertures thereby mechanically affixing the connector body to the circuit board and electrically connecting the terminal pins to the conductive members.

* * * * *